(12) United States Patent
Lin et al.

(10) Patent No.: US 10,685,735 B1
(45) Date of Patent: Jun. 16, 2020

(54) MEMORY MANAGEMENT METHOD, MEMORY STORAGE DEVICE AND MEMORY CONTROL CIRCUIT UNIT

(71) Applicant: PHISON ELECTRONICS CORP., Miaoli (TW)

(72) Inventors: Ping-Chuan Lin, Taipei (TW); Shii-Yeu Chern, Taipei (TW); Hsiang-Jui Huang, New Taipei (TW); Ping-Yu Hsieh, Tainan (TW); Zih-Jia Wang, Taoyuan (TW); Yun-You Lin, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/420,198

(22) Filed: May 23, 2019

(30) Foreign Application Priority Data

Apr. 10, 2019 (TW) ............... 108112510 A

(51) Int. Cl.
*G11C 29/00* (2006.01)
*G06F 11/18* (2006.01)
*G06F 3/06* (2006.01)
*G11C 16/34* (2006.01)

(52) U.S. Cl.
CPC ............ *G11C 29/76* (2013.01); *G06F 3/0619* (2013.01); *G06F 3/0638* (2013.01); *G06F 3/0679* (2013.01); *G06F 11/181* (2013.01); *G11C 16/349* (2013.01)

(58) Field of Classification Search
CPC ....... G11C 16/16; G11C 29/76; G11C 16/349; G11C 11/5635
See application file for complete search history.

(56) References Cited

U.S. PATENT DOCUMENTS

2011/0087950 A1* 4/2011 Yu .................. G06F 11/1072 714/773
2017/0185337 A1* 6/2017 Lee .................. G06F 3/0604

* cited by examiner

*Primary Examiner* — Han Yang
(74) *Attorney, Agent, or Firm* — JCIPRNET

(57) ABSTRACT

The invention provides a memory management method, a memory storage device, and a memory control circuit unit. The method includes: recording an error bit number of each upper physical programming unit and an error bit number of each lower physical programming unit of each of the physical erasing units; determining whether a first physical erasing unit is a bad physical erasing unit according to distributions of the error bit numbers of the upper physical programming units and the lower physical programming units of the first physical erasing unit of the physical erasing units; and performing a data transfer operation on data in the first physical erasing unit if the first physical erasing unit is determined as the bad physical erasing unit.

27 Claims, 10 Drawing Sheets

MEMORY MANAGEMENT METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 108112510, filed on Apr. 10, 2019. The entirety of the above-mentioned patent application is hereby incorporated by reference herein and made a part of this specification.

BACKGROUND

Technical Field

The invention relates to a memory management method, and particularly relates to a memory management method for determining the quality of a rewritable non-volatile memory module according to an error bit distribution and a memory control circuit unit and a memory storage device using the memory management method.

Description of Related Art

The markets of digital cameras, cellular phones, and MP3 players have expanded rapidly in recent years, resulting in escalated demand for storage media by consumers. Owing to the characteristics of data non-volatility, low power consumption, compact size, and having no mechanical structure exhibited by the rewritable non-volatile memory module (e.g., flash memory), the rewritable non-volatile memory module is ideal for being built in the portable multi-media devices mentioned above.

In general, the deterioration degree of a rewritable non-volatile memory module may be determined according to whether the maximum error bit number in a physical erasing unit exceeds a threshold or a threshold voltage distribution. However, in the case where only one of the physical programming units in a physical erasing unit has the maximum error bit number, while the rest physical programming units are still in a good condition, whether the physical erasing unit has been deteriorated cannot be directly determined solely based on that the maximum error bit number exceeds the threshold. Therefore, an operation for preventing data from losing cannot be carried out in advance.

Accordingly, how to determine the state of the rewritable non-volatile memory module to correspondingly adjust the data writing mechanism of the rewritable non-volatile memory module has become an issue for researchers in this field to work on.

SUMMARY

Exemplary embodiments of the invention provide a memory management method, a memory control circuit unit, and a memory storage device capable of determining a state of a physical erasing unit and preventing data from being lost.

An exemplary embodiment of the invention provides a memory management method configured for a rewritable non-volatile memory module. The memory management method includes a plurality of physical erasing units, and each of the physical erasing units includes a plurality of physical programming units. The memory management method includes: recording an error bit number of each upper physical programming unit and an error bit number of each lower physical programming unit of each of the physical erasing units; determining whether a first physical erasing unit of the physical erasing units is a bad physical erasing unit according to a distribution of the error bit numbers of the upper physical programming units and a distribution of the error bit numbers of the lower physical programming units of the first physical erasing unit; and performing a data transfer operation on data in the first physical erasing unit if the first physical erasing unit is determined as the bad physical erasing unit.

An exemplary embodiment of the invention provides a memory storage device. The memory storage device includes a connection interface unit, a rewritable non-volatile memory module, and a memory control circuit unit. The connection interface unit is coupled to a host system. The rewritable non-volatile memory module has a plurality of physical erasing units, and each of the physical erasing units includes a plurality of physical programming units. The memory control circuit unit is coupled to the connection interface unit and the rewritable non-volatile memory module. The memory control circuit unit is configured to record error bit numbers of upper physical programming units and error bit numbers of lower physical programming units of each of the physical erasing units. The memory control circuit unit is configured to determine whether a first physical erasing unit of the physical erasing units is a bad physical erasing unit according to a distribution of the error bit numbers of the upper physical programming units and a distribution of the error bit numbers of the lower physical programming units of the first physical erasing unit. In addition, the memory control circuit unit is further configured to perform a data transfer operation on data in the first physical erasing unit if the first physical erasing unit is determined as the bad physical erasing unit.

An exemplary embodiment of the invention provides a memory control circuit unit configured to control a rewritable non-volatile memory module including a plurality of physical erasing units. Each of the physical erasing units includes a plurality of physical programming units. The memory control circuit unit includes a host interface, a memory interface, and a memory management circuit. The host interface is configured to be coupled to a host system. The memory interface is configured to be coupled to the rewritable non-volatile memory module. The memory management circuit is coupled to the host interface and the memory interface. The memory management circuit is configured to record an error bit number of each upper physical programming unit and an error bit number of each lower physical programming unit of each of the physical erasing units, and determine whether a first physical erasing unit of the physical erasing units is a bad physical erasing unit according to a distribution of the error bit numbers of the upper physical programming units and a distribution of the error bit numbers of the lower physical programming units of the first physical erasing unit. The memory management circuit is configured to perform a data transfer operation on data in the first physical erasing unit if the first physical erasing unit is determined as the bad physical erasing unit.

Based on the above, the exemplary embodiments of the invention provide the memory management method, the memory storage device, and the memory control circuit unit, in which the parameters such as mean, standard deviation, median, etc., of the error bit numbers respectively corresponding to all the upper physical programming units and the lower physical programming units of the same physical erasing unit are obtained according to the distribution of the error bit numbers of the physical erasing unit, so as to determine whether the physical erasing unit is a bad physical erasing unit and thereby prevent data from being lost.

To make the aforementioned and other features of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and may be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
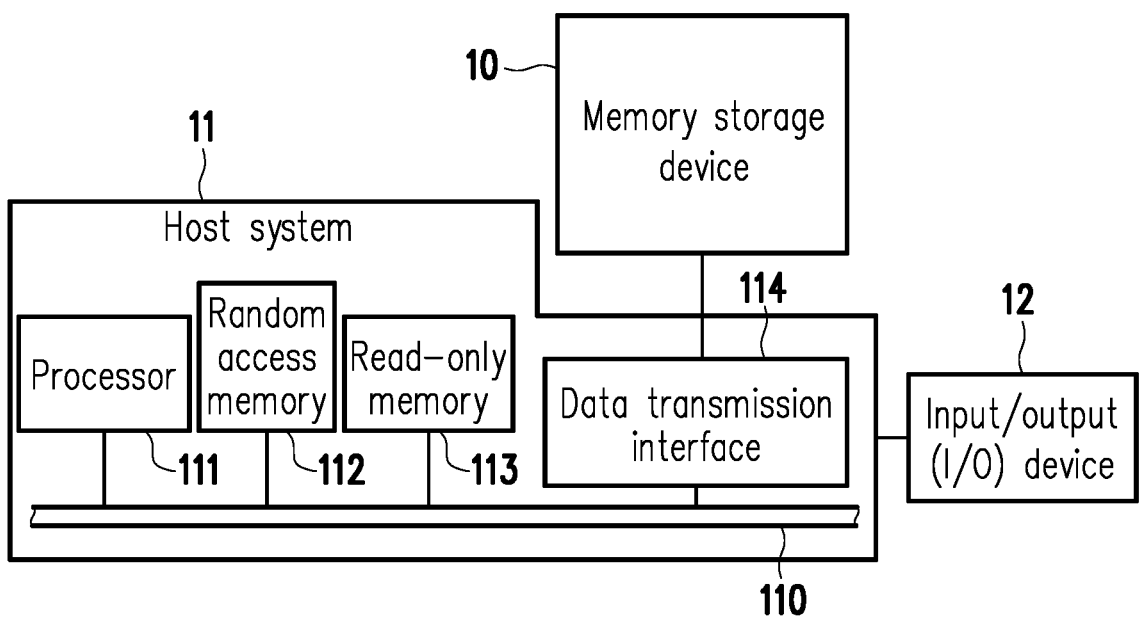
FIG. 1 is a schematic diagram of a host system, a memory storage device, and an input/output (I/O) device according to an exemplary embodiment of the invention.

Reference may now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (also referred to as a memory storage system) includes a rewritable non-volatile memory module and a controller (also referred to as a control circuit). The memory storage device is normally used together with a host system, allowing the host system to write data to the memory storage device or read data from the memory storage device.

Figure 2:
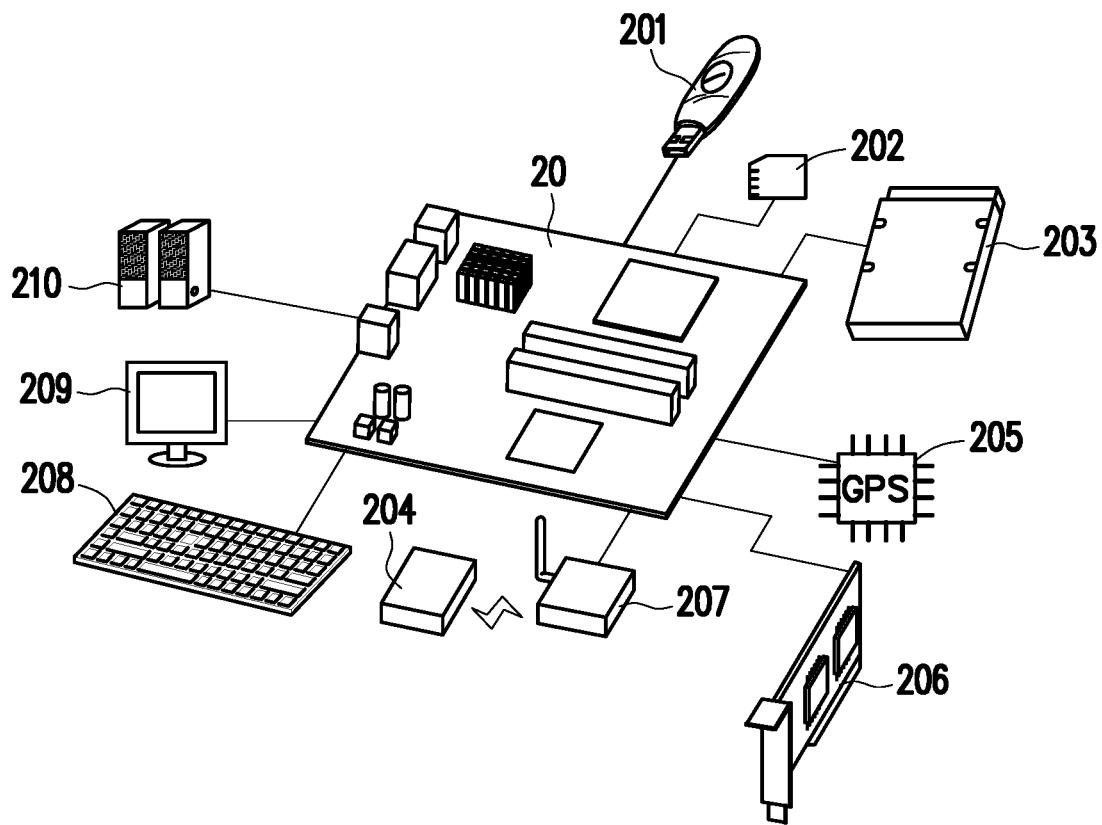
FIG. 2 is a schematic diagram of a host system, a memory storage device, and an input/output (I/O) device according to another exemplary embodiment of the invention.

FIG. 1 is a schematic diagram of a host system, a memory storage device, and an input/output (I/O) device according to an exemplary embodiment of the invention. FIG. 2 is a schematic diagram of a host system, a memory storage device, and an I/O device according to another exemplary embodiment of the invention.

Referring to FIG. 1 and FIG. 2, a host system 11 normally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In the exemplary embodiment, the processor 111, the random access memory 112, the read-only memory 113, and the data transmission interface 114 may be disposed on a motherboard 20 of the host system 11. The number of data transmission interfaces 114 may be one or more. The motherboard 20 may be coupled to the memory storage device 10 via a wired or a wireless method through the data transmission interface 114. The memory storage device 10 may be, for example, a flash drive 201, a memory card 202, a Solid State Drive (SSD) 203, or a wireless memory storage device 204. The wireless memory storage device 204 may be, for example, a Near Field Communication (NFC) memory storage device, a wireless fidelity (WiFi) memory storage device, a Bluetooth memory storage device, a Bluetooth low energy (BLE) memory storage device (e.g., iBeacon), or other memory storage devices based on various types of wireless communication technologies. In addition, the motherboard 20 may also be coupled to a Global Positioning System (GPS) module 205, a network interface card 206, a wireless transmission device 207, a keyboard 208, a screen 209, a speaker 210, or other types of I/O devices through the system bus 110. For example, in an exemplary embodiment, the motherboard 20 may access the wireless memory storage device 204 through the wireless transmission device 207.

Figure 3:
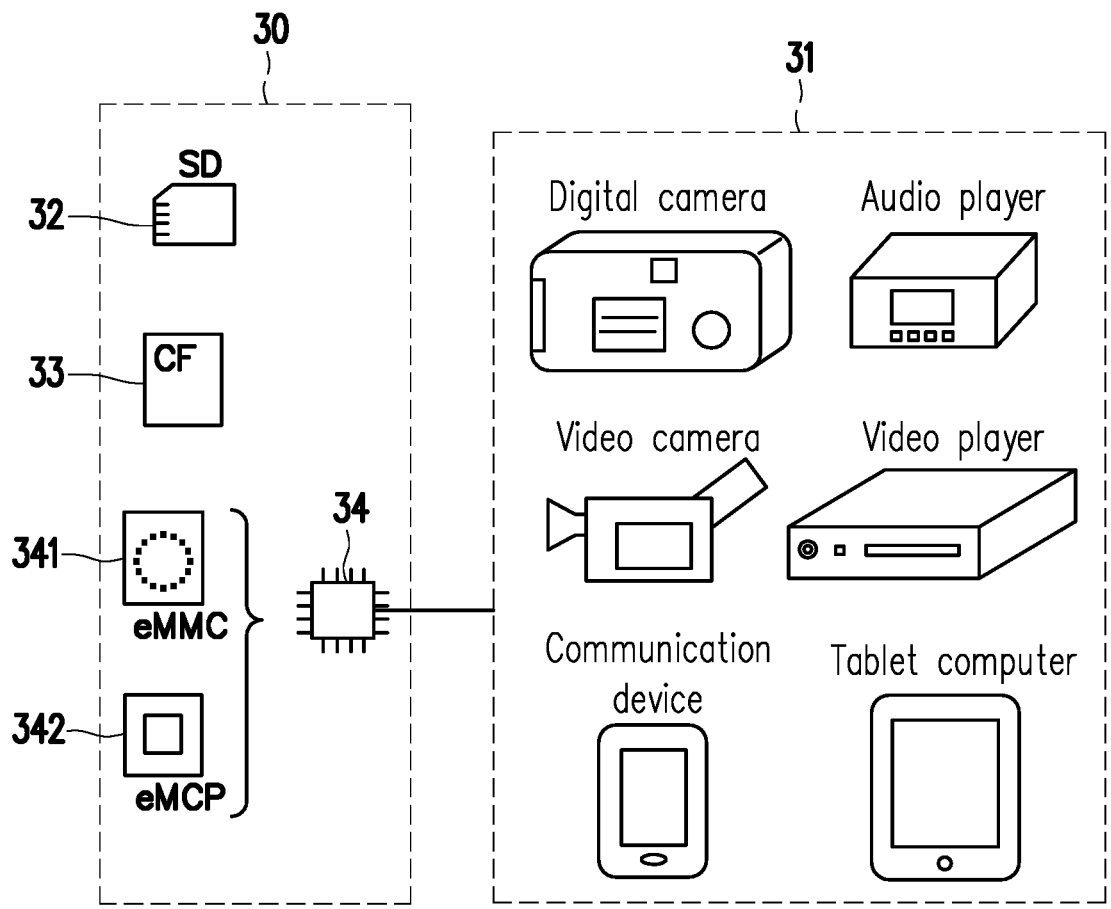
FIG. 3 is a schematic diagram of a host system and a memory storage device according to another exemplary embodiment of the invention.

In an exemplary embodiment, the host system mentioned may be any system that may substantially work with a memory storage device to store data. Although in the exemplary embodiments above, a computer system is used as the host system for illustration, FIG. 3 is a schematic diagram of a host system and a memory storage device according to another exemplary embodiment of the invention. Referring to FIG. 3, in another exemplary embodiment, a host system 31 may also be a digital camera, a video camera, a communication device, an audio player, a video player, a tablet computer, or other systems. A memory storage device 30 may be a secure digital (SD) card 32, a compact flash (CF) card 33, an embedded storage device 34, or other types of non-volatile memory storage devices used by the host system 31. The embedded storage device 34 includes an embedded multimedia card (eMMC) 341, and/or an embedded Multi Chip Package (eMCP) storage device 342, or various types of embedded storage devices which directly couple a memory module onto a substrate of a host system.

Figure 4:
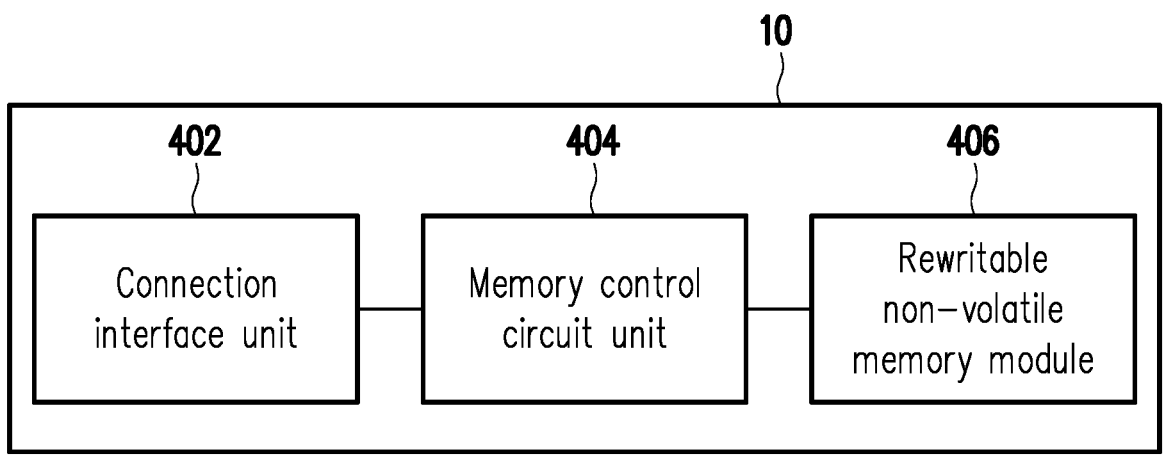
FIG. 4 is a functional block diagram of a memory storage device according to an exemplary embodiment of the invention.

FIG. 4 is a functional block diagram of a memory storage device according to an exemplary embodiment of the invention.

Referring to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. In the exemplary embodiment, the connection interface unit 402 is compatible with the Serial Advanced Technology Attachment (SATA) standard. However, it must be understood that the invention is not limited thereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed II (UHS-II) interface standard, the Memory Stick (MS) interface standard, the Multi-chip Package (MCP) interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged in one chip with the memory control circuit unit 404 or the connection interface unit 402 may be disposed outside a chip containing the memory control circuit unit 404.

The memory control circuit unit 404 is configured to perform multiple logic gates or control commands implemented using a hardware type or a firmware type and execute operations such as writing, reading, and erasing of data in the rewritable non-volatile memory module 406 according to the command of the host system 11.

The rewritable non-volatile memory module 406 is coupled to the memory control circuit unit 404 and is configured to store data written by the host system 11. The rewritable non-volatile memory module 406 may be a Single Level Cell (SLC) NAND flash memory module (i.e., a flash memory module which stores 1-bit in one memory cell), a Multi Level Cell (MLC) NAND flash memory module (i.e., a flash memory module which stores 2-bits in one memory cell), a Triple Level Cell (TLC) NAND flash memory module (i.e., a flash memory module which stores 3-bits in one memory cell), other flash memory modules, or other memory modules with the same characteristic.

Each memory cell of the rewritable non-volatile memory module 406 stores one or more bits by changing a voltage (also referred to as threshold voltage in the following). Specifically, a charge trapping layer is provided between the control gate and the channel of each memory cell. By applying a write voltage to the control gate, the quantity of electrons of the charge trapping layer is changed, and consequently the threshold voltage of the memory cell is changed. The process of changing the threshold voltage of the memory cell is also referred to "writing data to the memory cell" or "programming the memory cell". As the threshold voltage changes, each memory cell of the rewritable non-volatile memory module 406 has a plurality of storage states. By applying a read voltage, the storage state to which a memory cell belongs can be determined, and the one or more bits stored in the memory cell can thereby be obtained.

In the exemplary embodiment, the memory cells of the rewritable non-volatile memory module 406 may form a plurality of physical programming units, and the physical programming units may form a plurality of physical erasing units. Specifically, memory cells on the same word line may form one or more physical programming units. For example, if each memory cell is capable of storing three or more bits, the physical programming units on the same word line may be at least classified into a lower physical programming unit, a middle physical programming unit, and an upper physical programming unit. Taking a TLC NAND flash memory as an example, the least significant bits (LSB) of the memory cells on the same word line constitute a lower physical programming unit, the central significant bits (CSB) of the memory cells on the same word line constitute a middle physical programming unit, and the most significant bits (MSB) of the memory cells on the same word line constitute an upper physical programming unit. In general, in the TLC NAND flash memory, the writing speed of the lower physical programming unit is higher than the writing speeds of the middle physical programming unit and the upper physical programming unit, and/or the reliability of the lower physical programming unit is higher than the reliabilities of the middle physical programming unit and the upper physical programming unit.

In the exemplary embodiment, the physical programming unit is the minimum programming unit. In other words, the physical programming unit is the minimum unit for data writing. For example, the physical programming unit is a physical page or a physical sector. If the physical programming unit is a physical page, the physical programming units normally include a data bit region and a redundancy bit region. The data bit region includes a plurality of physical sectors and is configured to store user data, whereas the redundancy bit region serves to store system data (e.g., management data such as error checking/correcting code). In the exemplary embodiment, the data bit region includes 32 physical sectors, and the size of each physical sector is 512 bytes (Bs). However, in other exemplary embodiments, the data bit region may also include 8, 16, or more or fewer physical sectors, and the size of each physical sector may be greater or smaller. Meanwhile, the physical erasing unit is the minimum erasing unit. In other words, each physical erasing unit includes the minimum number of memory cells for being erased together. For example, the physical erasing unit may be a physical block.

Figure 5:
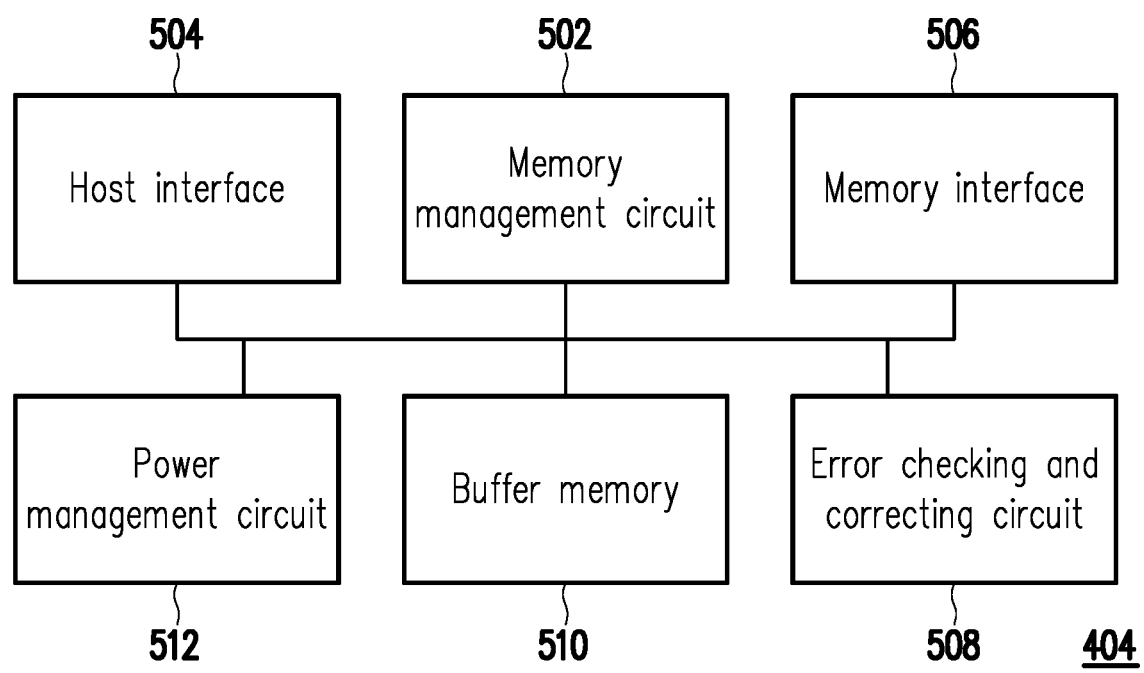
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504, and a memory interface 506.

The memory management circuit 502 is configured to control the overall configuration of the memory control circuit unit 404. Specifically, the memory management circuit 502 has a plurality of control commands. When the memory storage device 10 is operated, the control commands are executed to perform various operations such as data writing, data reading and data erasing. In the following, the descriptions about the operation of the memory management circuit 502 are equivalent to the descriptions about the operation of the memory control circuit unit 404.

In the exemplary embodiment, the control commands of the memory management circuit 502 are implemented as firmware. For instance, the memory management circuit 502 has a microprocessor unit (not shown) and a read-only memory (not shown), and the control commands are burnt into the read-only memory. When the memory storage device 10 is operated, the control commands are executed by the microprocessor unit for various operations, such as data writing, data reading or data erasing.

In another exemplary embodiment, the control commands of the memory management circuit 502 may also be stored as program codes in a specific region (e.g., the system region designated to store system data in the memory module) of the rewritable non-volatile memory module 406. Moreover, the memory management circuit 502 has a microprocessor unit (not shown), a read-only memory (not shown), and a random access memory (not shown). Specifically, the read-only memory has a boot code. When the memory control circuit unit 404 is enabled, the boot code is firstly executed by the microprocessor unit to load the control commands stored in the rewritable non-volatile memory module 406 to the random access memory of the memory management circuit 502. Afterwards, the microprocessor unit executes the control commands for various data operation such as data writing, data reading and data erasing.

Besides, in another exemplary embodiment, the control commands of the memory management circuit 502 may also be implemented as hardware. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to management the memory cells of the rewritable non-volatile memory module 406 or the groups thereof. The memory write circuit is configured to issue a write command sequence to the rewritable non-volatile memory module 406 to write data to the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence and the erase command sequence may respectively include one or more program codes or command codes and serve to instruct the rewritable non-volatile memory module 406 to execute the corresponding writing, reading, and erasing operations, etc. In an exemplary embodiment, the memory management circuit 502 may further issue other types of command sequences to the rewritable non-volatile memory module 406 to instruct the rewritable non-volatile memory module 406 to execute the corresponding operations.

The host interface 504 is coupled to the memory management circuit 502 and configured to receive and determine the command and data transmitted from the host system 11. In other words, the command and data transmitted from the host system 11 may be transmitted to the memory management circuit 502 through the host interface 504. In the exemplary embodiment, the host interface 504 is compatible with the SATA standard. However, the invention is not limited thereto. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. In other words, data to be written to the rewritable non-volatile memory module 406 is converted into a format acceptable to the rewritable non-volatile memory module 406 by the memory interface 506. Specifically, if the memory management circuit 502 intends to access the rewritable non-volatile memory module 406, the memory interface 506 may transmit the corresponding command sequence. For example, the command sequences may include the write command sequence instructing to write data, the read command sequence instructing to read data, the erase command sequence instructing to erase data, and the corresponding command sequences instructing to perform various memory operations (e.g., changing the read voltage level or executing a recycling operation, etc.). The command sequences are, for example, generated by the memory management circuit 502 and transmitted to the rewritable non-volatile memory module 406 through the memory interface 506. These command sequences may include one or more signals, or data on a bus. The signals or data may include command codes or program codes. For example, the read command sequence may include information of reading identification codes, memory addresses, etc.

In an exemplary embodiment, the memory control circuit unit 404 further includes an error checking and correcting circuit 508, a buffer memory 510, and a power management circuit 512.

The error checking and correcting circuit 508 is coupled to the memory management circuit 502 and configured to execute an error checking and correcting operation to ensure the accuracy of data. Specifically, when the memory management circuit 502 receives a write command from the host system 11, the error checking and correcting circuit 508 may generate a corresponding error correcting code (ECC) and/or error detecting code (EDC) for the data corresponding to the write command, and the memory management circuit 502 may write the data corresponding to the write command and the corresponding ECC and/or EDC to the rewritable non-volatile memory module 406. Afterwards, when reading data from the rewritable non-volatile memory module 406, the memory management circuit 502 may also read the ECC and/or EDC corresponding to the data, and the error checking and correcting circuit 508 may execute the error checking and correcting operation on the read data according to the ECC and/or EDC.

The buffer memory 510 is coupled to the memory management circuit 502 and configured to temporarily store data and commands from the host system 11 or data from the rewritable non-volatile memory module 406. The power management circuit 512 is coupled to the memory management circuit 502 and configured to control the power of the memory storage device 10.

Figure 6:
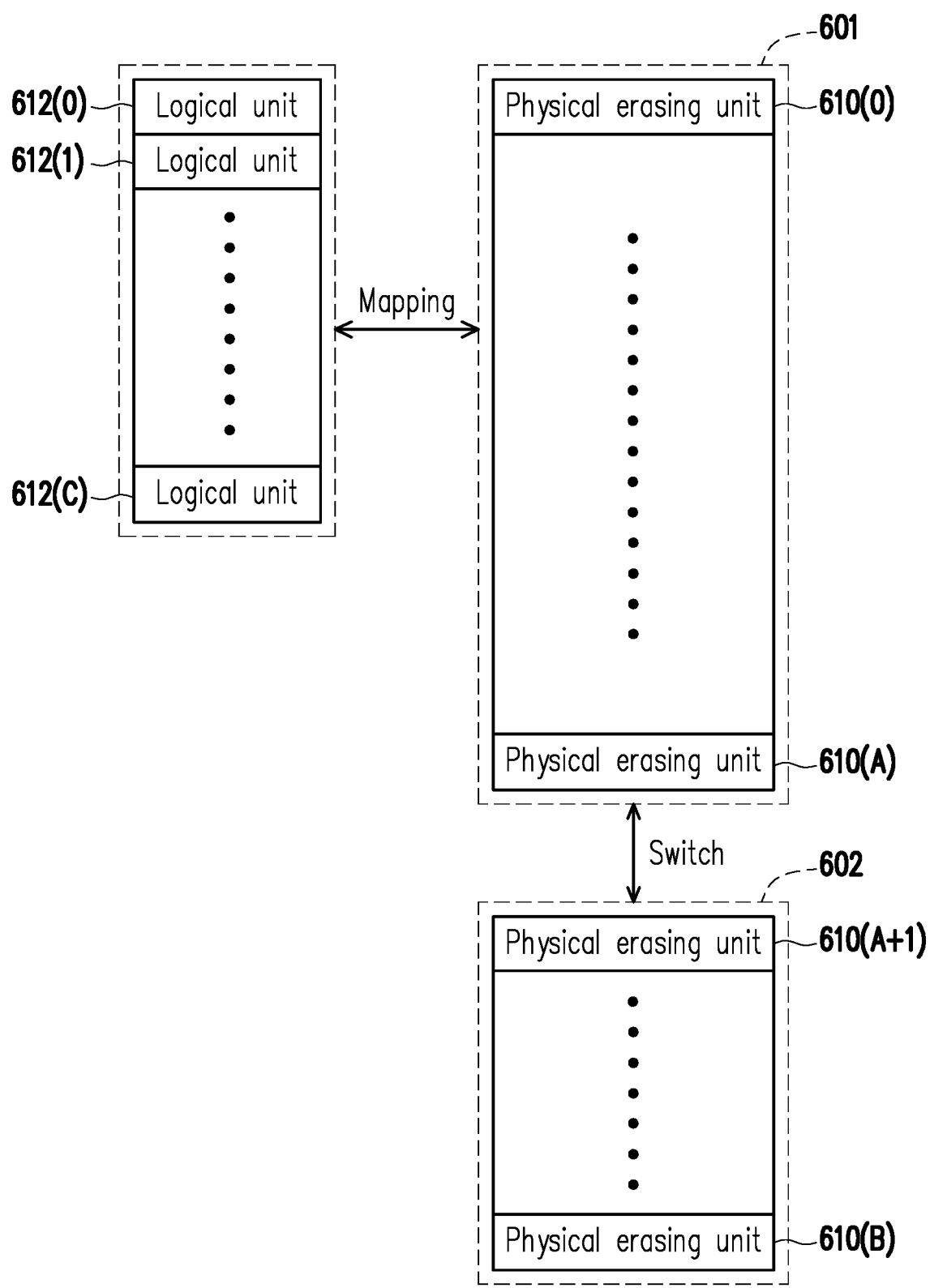
FIG. 6 is a schematic diagram illustrating managing a rewritable non-volatile memory module according to an exemplary embodiment of the invention.

FIG. 6 is a schematic diagram illustrating managing a rewritable non-volatile memory module according to an exemplary embodiment of the invention.

It should be understood that, in the descriptions about the management of the physical erasing units of the rewritable non-volatile memory module 406 in the following exemplary embodiments, terms such as "choosing" and "grouping" which describe operations on the physical erasing units denote concepts in a logical sense. In other words, the actual locations of the physical erasing units of the rewritable non-volatile memory module 406 remain the same, but logical operations are performed on the physical erasing units of the rewritable non-volatile memory module 406.

Referring to FIG. 6, the memory management circuit 502 may group physical erasing units 610(0) to 610(B) of the rewritable non-volatile memory module 406 into a storage region 610 and a spare region 602. For example, the physical erasing units 610(0) to 610(A) belong to the storage region 601, while the physical erasing units 610(A+1) to 610(B) belong to the spare region 602. In the exemplary embodiment, one physical erasing unit refers to one physical erasing unit. However, in another exemplary embodiment, one physical erasing unit may also include a plurality of physical erasing units. Besides, the memory management circuit 502 may associate one of the physical erasing units to one of the storage region 601 and the spare region 602 by labeling, etc.

In the operation of the memory storage device 10, the association relationship between one of the physical erasing units and the storage region 601 or the spare region 602 may be changed dynamically. For example, when receiving write data from the host system 11, the memory management circuit 502 may choose a physical erasing unit from the spare region 602 to store at least a portion of the write data and associate the physical erasing unit with the storage region 601. In addition, after erasing is performed on the data in a physical erasing unit belonging to the storage region 601 to remove the data, the memory management circuit 502 may associate the physical erasing unit whose data has been erased to the spare region 602.

In the exemplary embodiment, a physical erasing unit belonging to the spare region 602 is also referred to as a spare physical erasing unit, while a physical erasing unit belonging to the storage region 601 may also be referred to as a non-spare physical erasing unit. Each physical erasing unit belonging to the spare region 602 is a physical erasing unit whose data has been erased and which does not store any data, while each physical erasing unit belonging to the storage region 601 has data stored therein. More specifically, none of the physical erasing units belonging to the spare region 602 stores valid data, while each physical erasing unit belonging to the storage region 601 may possibly store valid data and/or invalid data.

In an exemplary embodiment, the memory management circuit 502 includes logical units 612(0) to 612(C) to map the physical erasing units of the storage region 601. In the exemplary embodiment, the host system 11 may access a physical erasing unit belonging to the storage region 601 through a logical address (LA). Therefore, each logical unit of the logical units 612(0) to 612(C) refers to a logical address. However, in another exemplary embodiment, each logical unit of the logical units 612(0) to 612(C) may also refer to a logical programming unit, a logical erasing unit, or be composed of a plurality of continuous or discontinuous logical addresses. Besides, each logical unit in the logical units 612(0) to 612(C) may be mapped to one or more physical erasing units.

In the exemplary embodiment, the memory management circuit 502 may record the mapping relationship between the logical units and the physical erasing units (also referred to a logical-physical mapping relationship) in at least one logical-physical mapping table. When the host system 11 intends to read data from or write data to the memory storage device 10, the memory management circuit 502 may access data from the memory storage device 10 according to the logical-physical mapping table.

In the exemplary embodiment, the TLC NAND flash memory module is described as an example. After data is written to the physical programming units of the physical erasing units 610(0) to 610(A) belonging to the storage region 601, since physical programming units on the same word line are classified into the upper physical programming unit, the middle physical programming unit, and the lower physical programming unit, the upper physical programming unit, the middle physical programming unit, and the lower physical programming unit in which data is written may correspondingly generate error bits.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |
| memory management circuit | MMC |
| error bit number | EBN |

The memory management circuit 502 may record the EBN of each upper PPU, the EBN of each middle PPU, and the EBN of each lower PPU of each PEU of the PEUs 610(0) to 610(A), In addition, the memory management circuit 502 may determine whether a PEU (e.g., the first PEU 610(0)) of the PEUs 610(0) to 610(A) is a bad PEU according to a distribution of the EBNs of the upper PPUs, a distribution of the EBNs of the middle PPUs, and a distribution of the EBNs of the lower PPUs of each PEU of the PEUs 610(0) to 610(A). After determining whether the first PEU 610(0) is a bad PEU, the memory management circuit 502 may go on to make a determination on each of other PEUs, thereby determining the state of the RNVM module 406.

In the following exemplary embodiment, details are described to explain how the memory management circuit 502 obtains parameters such as mean, standard deviation, medians, etc., of the EBNs of the upper PPUs, the middle PPUs, and the lower PPUs of each PEU according to the distribution of the EBNs of the upper PPUs, the distribution of the EBNs of the middle PPUs, and the distribution of the EBNs of the lower PPUs of each PEU, so as to determine whether the PEU is a bad PEU.

In an exemplary embodiment, taking determining whether the first PEU 610(0) of the PEUs 610(0) to 610(A) is a bad PEU as an example, the memory management circuit 502 may respectively calculate a mean XP of the EBNs of all the upper PPUs, a mean UP of the EBNs of all the middle PPUs, and a mean LP of the EBNs of all the lower PPUs of the first PEU 610(0) according to the distribution of the EBNs of the upper PPUs, the distribution of the EBNs of the middle PPUs, and the distribution of the EBNs of the lower PPUs of the first PEU 610(0).

If the mean XP of the EBNs of all the upper PPUs is greater than the mean UP of the EBNs of all the middle PPUs, and the mean UP of the EBNs of all the middle PPUs is greater than the mean LP of the EBNs of all the lower PPUs in the first PEU 610(0), the memory management circuit 502 may determine the first PEU 610(0) as a bad PEU. In other words, when XP>UP>LP is met, the memory management circuit 502 may determine the first PEU 610(0) as a bad PEU. In addition, after the first PEU 610(0) is determined as a bad PEU, the memory management circuit 502 may perform a data transfer operation on the data in the first PEU 610(0).

Here, in an exemplary embodiment, the memory management circuit 502 may transfer the data stored in the first PEU 610(0) to the second PEU 610(1), directly classify the first PEU 610(0) as a bad PEU, and stop using the first PEU 610(0) in subsequent data accessing processes. In another exemplary embodiment, the memory management circuit 502 may also transfer the data stored in the first PEU 610(0) to the third PEU 610(A+1) of the spare region 602. In other words, the memory management circuit 502 may choose the third PEU 610(A+1) from the spare region 602 and associate the third PEU 610(A+1) with the storage region 601. Then, the memory management circuit 502 may perform an erase operation on the first PEU 610(0), and the memory management circuit 502 may classify the first PEU 610(0) as a bad PEU under the circumstance that a programming error occurs in a process of programming another data to the first PEU 610(0) at the time of programming the another data to the first PEU 610(0).

In another exemplary embodiment, the memory management circuit 502 may determine whether the first PEU 610(0) is not a bad PEU according to whether the distribution of the EBNs of the first PEU 610(0) is a normal distribution.

In the exemplary embodiment, the memory management circuit 502 may respectively obtain the distribution of the EBNs of the upper PPUs, the distribution of the EBNs of the middle PPUs, and the distribution of the EBNs of the lower PPUs in each PEU of the PEUs 610(0) to 610(A) according to Formula (1).

$$f(x; \mu, \sigma) = \frac{1}{\sigma\sqrt{2\pi}} \exp\left(-\frac{(x-\mu)^2}{2\sigma^2}\right) \quad (1)$$

In Formula (1), $\mu$ is a mean of the EBNs of the upper PPUs, the middle PPUs, and the lower PPUs of each PEU of the PEUs 610(0) to 610(A), $\sigma$ is a standard deviation of the EBNs of the upper PPUs, the middle PPUs, and the lower PPUs of each PEU of the PEUs 610(0) to 610(A), $\sigma^2$ is a variance of the EBNs of the upper PPUs, the middle PPUs, and the lower PPUs of each PEU of the PEUs 610(0) to 610(A), x is the EBNs of the upper PPUs, the middle PPUs, and the lower PPUs of each PEU of the PEUs 610(0) to 610(A), and $f(x;\mu\sigma)$ is a distribution of the EBNs of each PEU of the PEUs 610(0) to 610(A).

Figure 7:
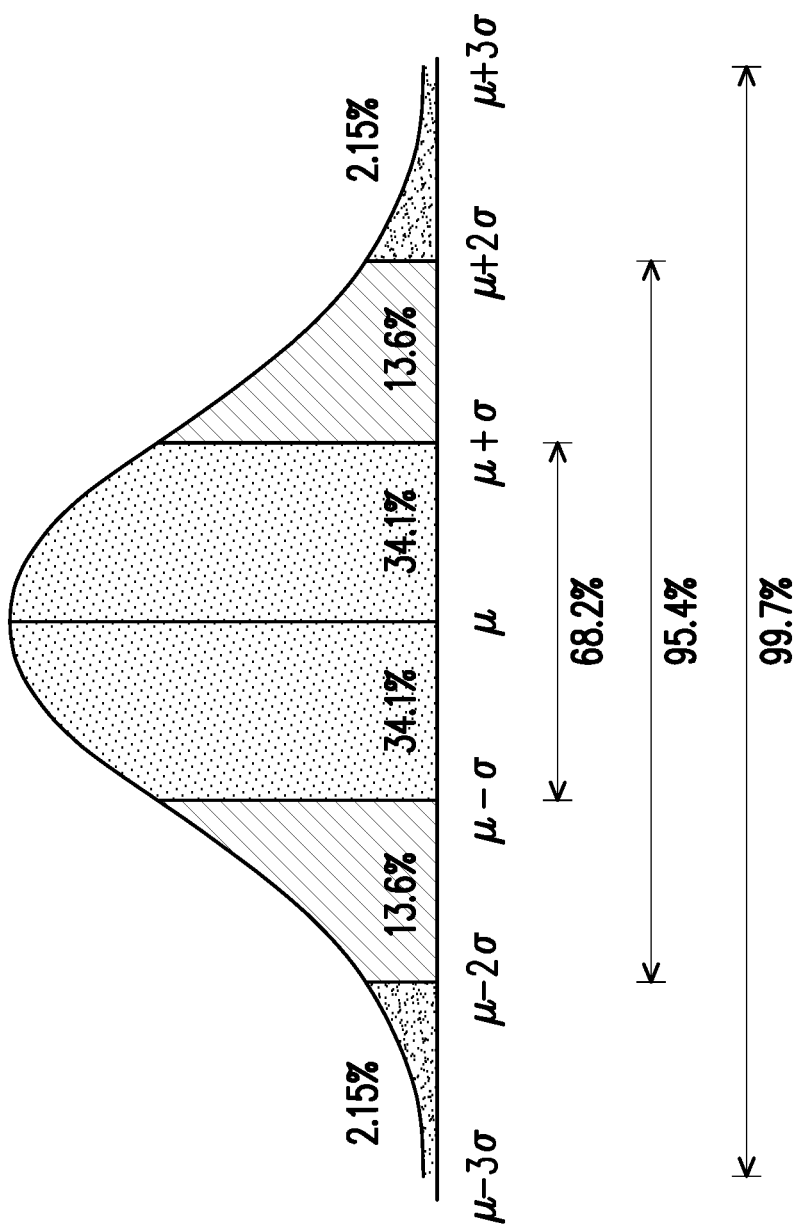
FIG. 7 is a schematic diagram illustrating a distribution of error bit numbers of a first physical erasing unit 610(0) according to another exemplary embodiment of the invention.

FIG. 7 is a schematic diagram illustrating a distribution of EBNs of a first PEU 610(0) according to another exemplary embodiment of the invention.

According to FIG. 7, the probability that x occurs within one standard deviation is about 68.2%, i.e., satisfying Equation (2), wherein x is the EBNs of the upper PPUs, the middle PPUs, and the lower PPUs of the first PEU 610(0).

$$Pr(\mu-\sigma \leq X \leq \mu+\sigma) \approx 0.6827 \quad (2)$$

The probability that x occurs within two standard deviations is about 95.4%, i.e., satisfying Equation (3):

$$Pr(\mu-2\sigma \leq X \leq \mu+2\sigma) \approx 0.9545 \quad (3)$$

The probability that x occurs within three standard deviations is about 99.7%, i.e., satisfying Equation (4):

$$Pr(\mu-3\sigma \leq X \leq \mu+3\sigma) \approx 0.9973 \quad (4)$$

In other words, when the probabilities that x occur within one standard deviation, two standard deviations, and three standard deviations are respectively about 68.2%, 95.4%, and 99.7%, the distribution of the EBNs of the first PEU 610(0) is a normal distribution, and the memory management circuit 502 may determine the first PEU 610(0) as a not bad PEU.

In another exemplary embodiment, the memory management circuit 502 may determine whether the first PEU 610(0) is a bad PEU according to whether the distribution of the EBNs of the first PEU 610(0) is skewed. Specifically, the memory management circuit 502 may determine whether the first PEU 610(0) is a bad PEU according to a mean Mean of the EBNs of the first PEU 610(0), an EBN Mode corresponding to the most PPUs in the first PEU 610(0) and a median Median in a plurality of groups of EBNs corresponding to the PPUs of the first PEU 610(0) (i.e., the middle value of a plurality of groups of EBNs corresponding to the PPUs).

Figure 8C:
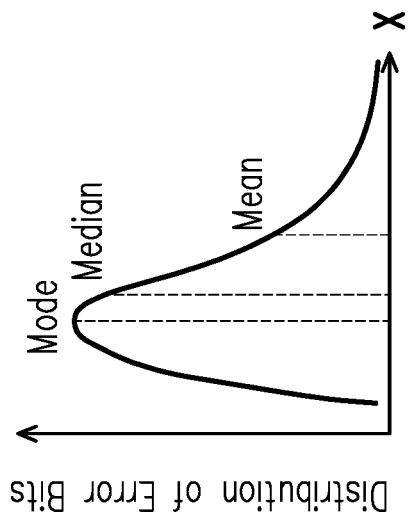
FIG. 8C is a schematic diagram illustrating a case in which a distribution of error bit numbers of the first physical erasing unit is left skewed, which is more favorable than right skewed, according to another exemplary embodiment of the invention.
Figure 8B:
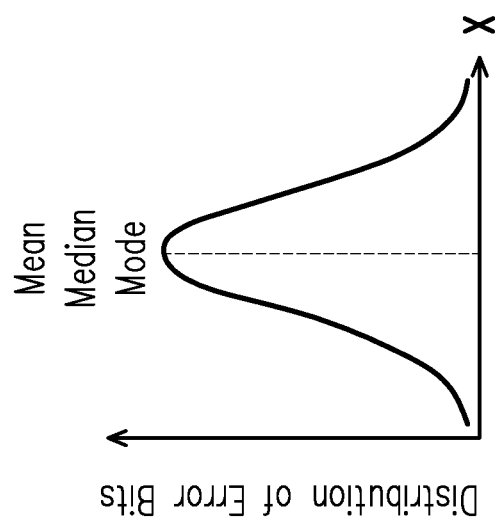
FIG. 8B is a schematic diagram illustrating a case in which a distribution of error bit numbers of the first physical erasing unit is not skewed according to another exemplary embodiment of the invention.
Figure 8A:
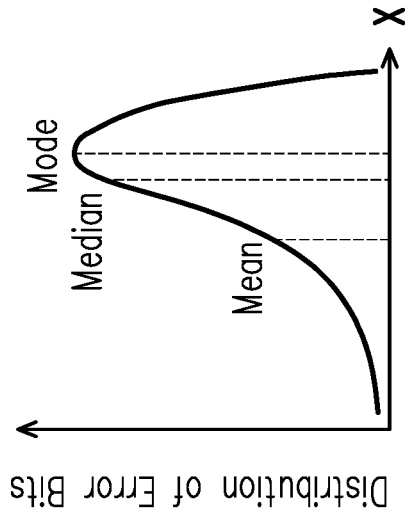
FIG. 8A is a schematic diagram illustrating a worse case in which a distribution of error bit numbers of a first physical erasing unit is right skewed according to another exemplary embodiment of the invention.

Referring to FIG. 8A, FIG. 8A is a schematic diagram illustrating a worse case in which a distribution of the EBNs of the first PEU 610(0) is right skewed according to another exemplary embodiment of the invention. If the EBN Mode corresponding to the most PPUs in the first PEU 610(0) is greater than the median Median of the groups of EBNs corresponding to the PPUs of the first PEU 610(0), and the median Median of the groups of EBNs corresponding to the PPUs of the first PEU 610(0) is greater than the mean Mean of the EBNs of the first PEU 610(0), i.e., when Mode>Median>Mean is met, the memory management circuit 502 may determine the first PEU 610(0) as a bad PEU and perform the data transfer operation on the data stored in the first PEU 610(0). Details concerning the data transfer operation have been described in the foregoing and therefore shall not be repeated in the following.

Figure 8D:
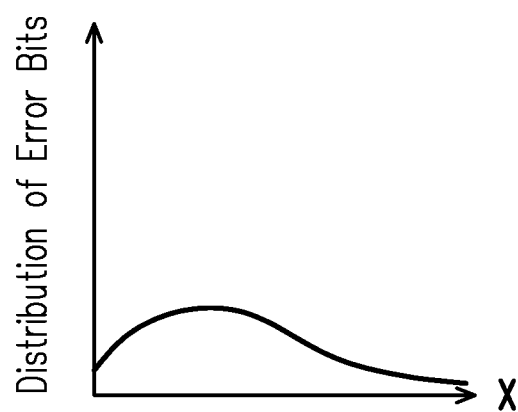
FIG. 8D is a schematic diagram illustrating a distribution of error bit numbers of the first physical erasing unit in an aged state according to another exemplary embodiment of the invention.

As another example, FIG. 8B is a schematic diagram illustrating a case in which a distribution of EBNs of the first PEU is not skewed according to another exemplary embodiment of the invention. Also, as shown in FIG. 8C, FIG. 8C is a schematic diagram illustrating a case in which a distribution of EBNs of the first PEU 610(0) is left skewed, which is more favorable than right skewed, according to another exemplary embodiment of the invention. If the mean Mean of the EBNs of the first PEU 610(0) is greater than the median Median of the groups of EBNs corresponding to the PPUs of the first PEU 610(0), and the median Median of the groups of EBNs corresponding to the PPUs of the first PEU 610(0) is greater than the EBN Mode corresponding to the most PPUs of the first PEU 610(0), i.e., when Mode>Median>Mean is met, the memory management circuit 502 may determine the first PEU 610(0) as a good PEU and does not perform the data transfer operation on the data stored in the first PEU 610(0). As yet another example, FIG. 8D is a schematic diagram illustrating a distribution of EBNs of the first PEU in an aged state according to another exemplary embodiment of the invention. As shown in FIG. 8D, the EBNs of the first PEU 610(0) exhibit a flat distribution. The first PEU 610(0) in an aged state has a higher chance of being determined as a bad PEU. It should be noted that, while the above describes the TLC NAND flash memory as an example, in another exemplary embodiment, the above descriptions are also applicable to an MLC NAND flash memory. The memory management circuit 502 may obtain the parameters such as mean, standard deviation, and median, etc., of the EBNs of the upper PPUs and the lower PPUs in the first PEU 610(0) according to the distribution of the EBNs of the first PEU 610(0), so as to determine whether the first PEU 610(0) is a bad PEU. For example, if the mean XP of the EBNs of the upper PPUs is greater than the mean LP of the EBNs of the lower PPUs in the first PEU 610(0), the memory management circuit 502 may determine the first PEU 610(0) as a bad PEU. In other words, when XP>LP is met, the memory management circuit 502 may determine the first PEU 610(0) as a bad PEU. In addition, after the first PEU 610(0) is determined as a bad PEU, the memory management circuit 502 may perform the data transfer operation on the data in the first PEU 610(0).

Figure 9:
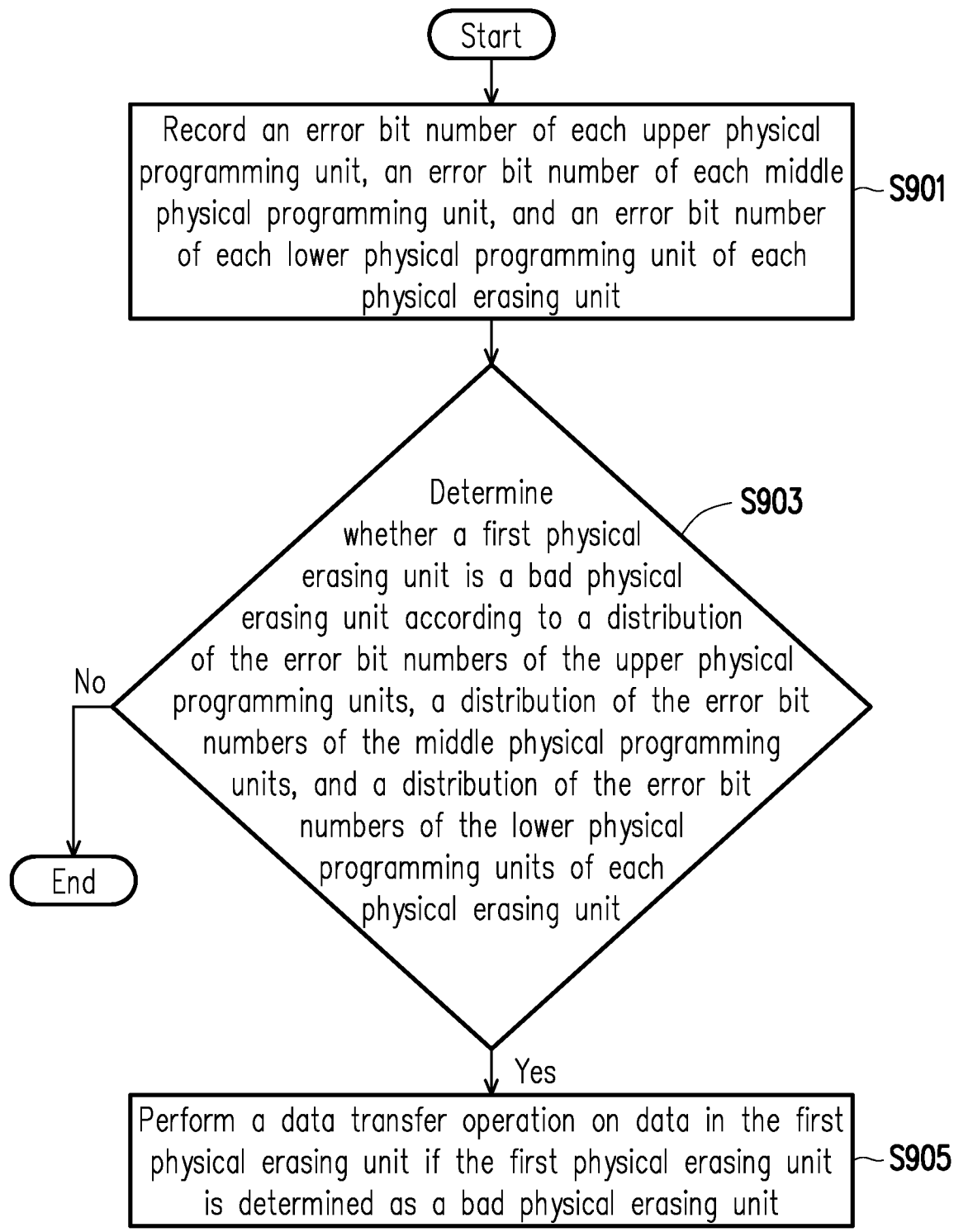
FIG. 9 is a flowchart illustrating a memory management method according to an exemplary embodiment of the invention.

FIG. 9 is a flowchart illustrating a memory management method according to an exemplary embodiment of the invention.

Referring to FIG. 9, in Step S901, the memory management circuit 502 may record the EBN of each upper PPU, the EBN of each middle PPU, and the EBN of each lower PPU of each PEU of the PEUs 610(0) to 610(A).

In Step S903, the memory management circuit 502 may determine whether the first PEU 610(0) is a bad PEU according to the distribution of the EBNs of the upper PPUs, the distribution of the EBNs of the middle PPUs, and the distribution of the EBNs of the lower PPUs of the first PEU 610(0).

If the memory management circuit 502 determines the first PEU 610(0) as a bad PEU, in Step S905, the memory management circuit 502 may perform the data transfer operation on the data in the first PEU 610(0).

Figure 10:
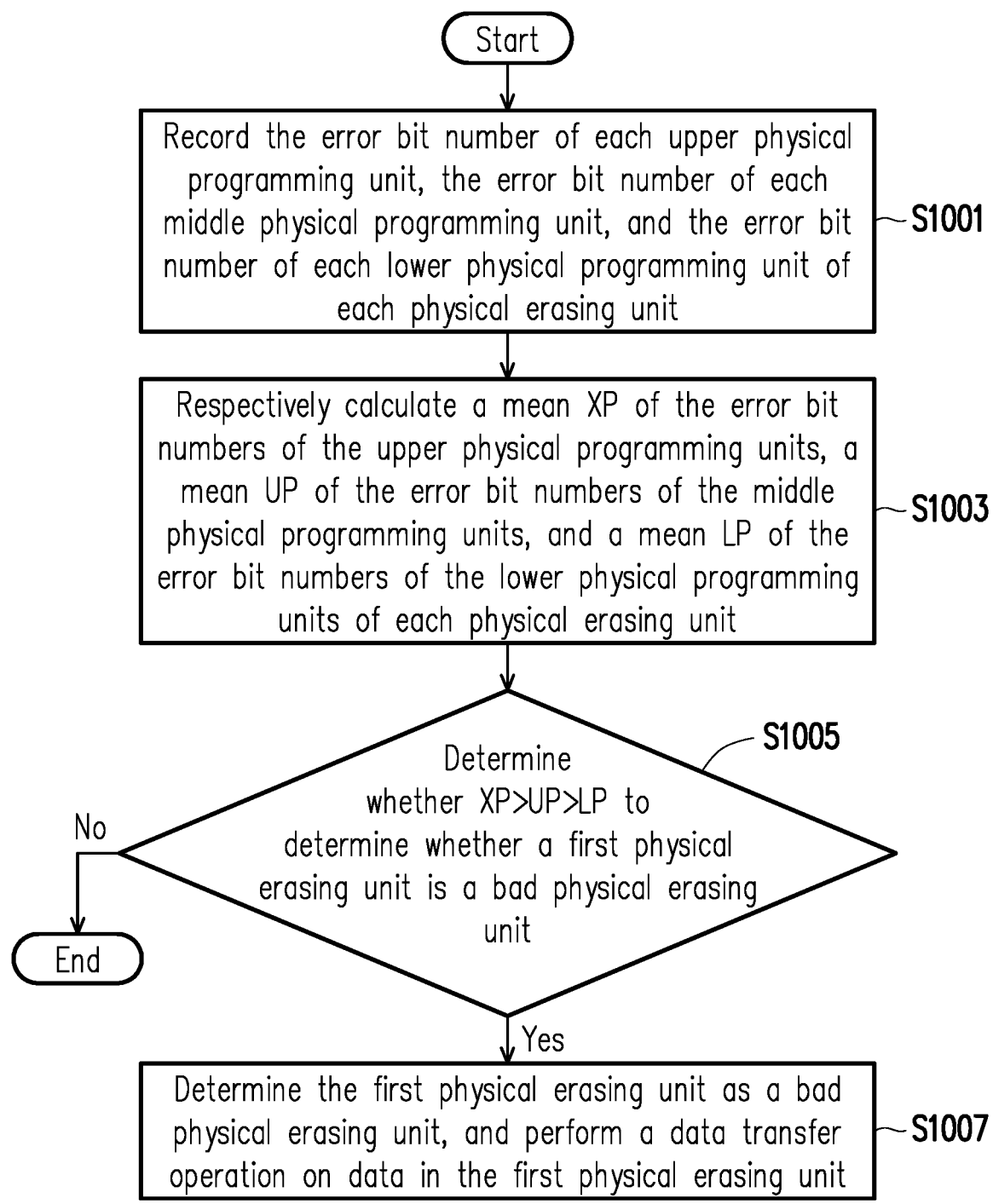
FIG. 10 is a flowchart illustrating a memory management method according to another exemplary embodiment of the invention.

FIG. 10 is a flowchart illustrating a memory management method according to another exemplary embodiment of the invention.

Referring to FIG. 10, in Step S1001, the memory management circuit 502 may record the EBN of each upper PPU, the EBN of each middle PPU, and the EBN of each lower PPU of each PEU of the PEUs 610(0) to 610(A).

In Step S1003, the memory management circuit 502 may respectively calculate the mean XP of the EBNs of the upper PPUs, the mean UP of the EBNs of the middle PPUs, and the mean LP of the EBNs of the lower PPUs of each PEU of the PEUs 610(0) to 610(A).

In Step S1005, the memory management circuit 502 may determine whether XP>UP>LP is met to determine whether the first PEU 610(0) is a bad PEU.

If the mean XP of the EBNs of the upper PPUs is greater than the mean UP of the EBNs of the middle PPUs, and the mean UP of the EBNs of the middle PPUs is greater than the mean LP of the EBNs of the lower PPUs in the first PEU 610(0) of the PEUs 610(0) to 610(A), i.e., XP>UP>LP is met, in Step S1007, the memory management circuit 502 may determine the first PEU 610(0) as a bad PEU and perform the data transfer operation on the data in the first PEU 610(0).

Figure 11:
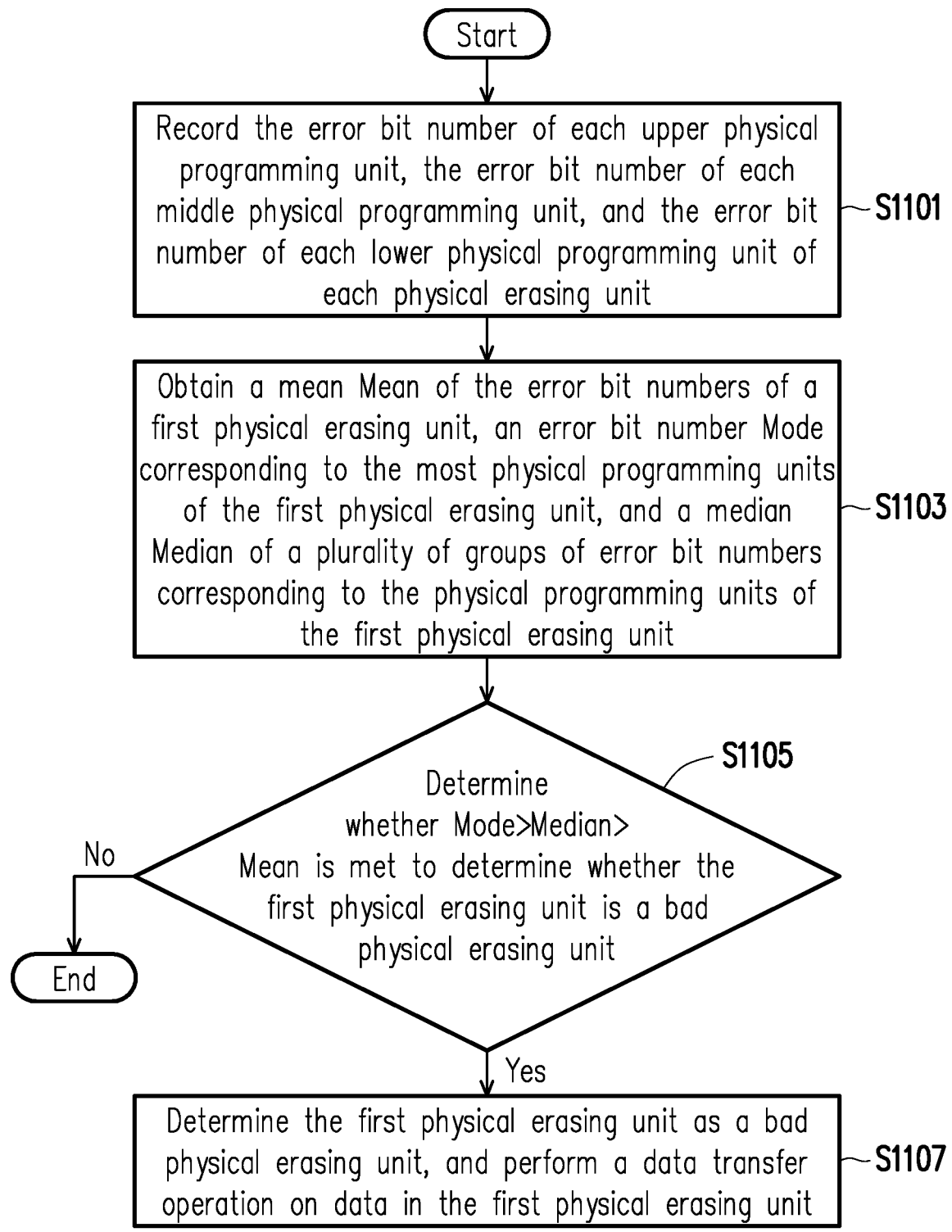
FIG. 11 is a flowchart illustrating a memory management method according to another exemplary embodiment of the invention.

FIG. 11 is a flowchart illustrating a memory management method according to another exemplary embodiment of the invention.

Referring to FIG. 11, in Step S1101, the memory management circuit 502 may record the EBN of each upper PPU, the EBN of each middle PPU, and the EBN of each lower PPU of each PEU of the PEUs 610(0) to 610(A).

In Step S1103, the memory management circuit 502 may obtain the mean Mean of the EBNs of the first PEU 610(0) of the PEUs 610(0) to 610(A), the EBN Mode corresponding to the most PPUs in the first PEU 610(0), and the median Median of the groups of EBNs corresponding to the PPUs in the first PEU 610(0).

In Step S1105, the memory management circuit 502 may determine whether Mode>Median>Mean is met to determine whether the first PEU 610(0) is a bad PEU.

If Mode>Median>Mean is met, in Step S1107, the memory management circuit 502 may determine the first PEU 610(0) as a bad PEU and perform the data transfer operation on the data in the first PEU 610(0).

In view of the foregoing, the exemplary embodiments of the invention provide a memory management method, a memory storage device, and a memory control circuit unit, in which at least the parameters such as mean, standard deviation, median, etc., of the EBNs respectively corresponding to all the upper PPUs and the lower PPUs of the same PEU are obtained according to the distribution of the EBNs, so as to determine whether the PEU is a bad PEU and successively make determinations on all the PEUs of the RNVM module 406, thereby determining the quality of the RNVM module 406 and correspondingly adjusting the data reading/writing mechanism of the RNVM module 406.

The previously described exemplary embodiments of the present invention have the advantages aforementioned, wherein the advantages aforementioned not required in all versions of the invention.

It may be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A memory management method, configured for a rewritable non-volatile memory module, wherein the rewritable non-volatile memory module comprises a plurality of physical erasing units, each of the physical erasing units comprises a plurality of physical programming units, and the memory management method comprises:
  recording an error bit number of each upper physical programming unit and an error bit number of each lower physical programming unit of each of the physical erasing units;
  determining whether a first physical erasing unit of the physical erasing units is a bad physical erasing unit according to a distribution of the error bit numbers of the upper physical programming units and a distribution of the error bit numbers of the lower physical programming units of the first physical erasing unit of the physical erasing units; and
  performing a data transfer operation on data in the first physical erasing unit if the first physical erasing unit is determined as the bad physical erasing unit.

2. The memory management method as claimed in claim 1, wherein determining whether the first physical erasing unit is the bad physical erasing unit according to the distribution of the error bit numbers of the upper physical programming units and the distribution of the error bit numbers of the lower physical programming units of the first physical erasing unit of the physical erasing units comprises:
  respectively calculating a mean of the error bit numbers of the upper physical programming units and a mean of the error bit numbers of the lower physical programming units of each of the physical erasing units; and
  determining the first physical erasing unit as the bad physical erasing unit if the mean of the error bit numbers of the upper physical programming units is greater than the mean of the error bit numbers of the lower physical programming units in the first physical erasing unit.

3. The memory management method as claimed in claim 1, further comprising:
  recording an error bit number of each middle physical programming unit of each of the physical erasing units,
  wherein determining whether the first physical erasing unit is the bad physical erasing unit according to the distribution of the error bit numbers of the upper physical programming units and the distribution of the error bit numbers of the lower physical programming units of the first physical erasing unit of the physical erasing units comprises:
  determining whether the first physical erasing unit is the bad physical erasing unit according to the distribution of the error bit numbers of the upper physical programming units, a distribution of the error bit numbers of the middle physical programming units, and the distribution of the error bit numbers of the lower physical programming units of the first physical erasing unit of the physical erasing units.

4. The memory management method as claimed in claim 3, wherein determining whether the first physical erasing unit is the bad physical erasing unit according to the distribution of the error bit numbers of the upper physical programming units, the distribution of the error bit numbers of the middle physical programming units, and the distribution of the error bit numbers of the lower physical programming units of the first physical erasing unit of the physical erasing units comprises:
  respectively calculating a mean of the error bit numbers of the upper physical programming units, a mean of the error bit numbers of the middle physical programming units, and a mean of the error bit numbers of the lower physical programming units of each of the physical erasing units; and
  determining the first physical erasing unit as the bad physical erasing unit if the mean of the error bit numbers of the upper physical programming units is greater than the mean of the error bit numbers of the middle physical programming units and the mean of the error bit numbers of the middle physical programming units is greater than the mean of the error bit numbers of the lower physical programming units in the first physical erasing unit.

5. The memory management method as claimed in claim 3 further comprising:
  respectively obtaining the distribution of the error bit numbers of the upper physical programming units, the distribution of the error bit numbers of the middle physical programming units, and the distribution of the error bit numbers of the lower physical programming units of each of the physical erasing units according to Formula (1), $$f(x; \mu, \sigma) = \frac{1}{\sigma\sqrt{2\pi}} \exp\left(-\frac{(x-\mu)^2}{2\sigma^2}\right) \quad (1)$$

wherein $\mu$ is a mean of the error bit numbers of the upper physical programming units, the middle physical programming units, and the lower physical programming units of each of the physical erasing units, $\sigma$ is a standard deviation of the error bit numbers of the upper physical programming units, the middle physical programming units, and the lower physical programming units of each of the physical erasing units, $\sigma^2$ is a variance of the error bit numbers of the upper physical programming units, the middle physical programming units, and the lower physical programming units of each of the physical erasing units, and x is the error bit numbers of the upper physical programming units, the middle physical programming units, and the lower physical programming units of each of the physical erasing units.

6. The memory management method as claimed in claim 5, wherein respectively obtaining the distribution of the error bit numbers of the upper physical programming units, the distribution of the error bit numbers of the middle physical programming units, and the distribution of the error bit numbers of the lower physical programming units of each of the physical erasing units according to Formula (1) comprises:
  a distribution of the error bit numbers corresponding to the first physical erasing unit being a normal distribution and determining the first physical erasing unit as not the bad physical erasing unit if a probability that x occurs within one standard deviation is 68.2%, a probability that x occurs within two standard deviations is 95.4%, and a probability that x occurs within three standard deviations is 99.7%.

7. The memory management method as claimed in claim 3, wherein determining whether the first physical erasing unit of the physical erasing units is the bad physical erasing unit according to the distribution of the error bit numbers of the upper physical programming units, the distribution of the error bit numbers of the middle physical programming units, and the distribution of the error bit numbers of the lower physical programming units of each of the physical erasing units comprises:
  determining whether the first physical erasing unit is the bad physical erasing unit according to a mean of error bit numbers of the first physical erasing unit, an error bit number corresponding to the most physical programming units in the first physical erasing unit, and a median of a plurality of groups of error bit numbers corresponding to the physical programming units in the first physical erasing unit.

8. The memory management method as claimed in claim 7, further comprising:
determining the first physical erasing unit as the bad physical erasing unit if the error bit number corresponding to the most physical programming units in the first physical erasing unit is greater than the median of the groups of error bit numbers corresponding to the physical programming units in the first physical erasing unit, and the median of the groups of error bit numbers corresponding to the physical programming units in the first physical erasing unit is greater than the mean of the error bit numbers of the first physical erasing unit.

9. The memory management method as claimed in claim 1, wherein performing the data transfer operation on the data in the first physical erasing unit comprises:
moving the data in the first physical erasing unit to a second physical erasing unit of the physical erasing units.

10. A memory storage device, comprising:
a connection interface unit, coupled to a host system;
a rewritable non-volatile memory module, wherein the rewritable non-volatile memory module comprises a plurality of physical erasing units, and each of the physical erasing units comprises a plurality of physical programming units; and
a memory control circuit unit, coupled to the connection interface unit and the rewritable non-volatile memory module,
wherein the memory control circuit unit is configured to record an error bit number of each upper physical programming unit and an error bit number of each lower physical programming unit of each of the physical erasing units,
wherein the memory control circuit unit is configured to determine whether a first physical erasing unit is a bad physical erasing unit according to a distribution of the error bit numbers of the upper physical programming units and a distribution of the error bit numbers of the lower physical programming units of the first physical erasing unit of the physical erasing units, and
wherein the memory control circuit unit is further configured to perform a data transfer operation on data in the first physical erasing unit if the first physical erasing unit is determined as the bad physical erasing unit.

11. The memory storage device as claimed in claim 10, wherein
the memory control circuit unit is further configured to respectively calculate a mean of the error bit numbers of the upper physical programming units and a mean of the error bit numbers of the lower physical programming units of each of the physical erasing units, and
the memory control circuit unit determines the first physical erasing unit as the bad physical erasing unit if the mean of the error bit numbers of the upper physical programming units is greater than the mean of the error bit numbers of the lower physical programming units in the first physical erasing unit.

12. The memory storage device as claimed in claim 10, wherein the memory control circuit unit is further configured to record an error bit number of each middle physical programming unit of each of the physical erasing units, and
the memory control circuit unit is further configured to determine whether the first physical erasing unit is the bad physical erasing unit according to the distribution of the error bit numbers of the upper physical programming units, a distribution of the error bit numbers of the middle physical programming units, and the distribution of the error bit numbers of the lower physical programming units of the first physical erasing unit of the physical erasing units.

13. The memory storage device as claimed in claim 12, wherein
the memory control circuit is further configured to respectively calculate a mean of the error bit numbers of the upper physical programming units, a mean of the error bit numbers of the middle physical programming units, and a mean of the error bit numbers of the lower physical programming units of each of the physical erasing units, and
the memory control circuit unit is further configured to determine the first physical erasing unit as the bad physical erasing unit if the mean of the error bit numbers of the upper physical programming units is greater than the mean of the error bit numbers of the middle physical programming units and the mean of the error bit numbers of the middle physical programming units is greater than the mean of the error bit numbers of the lower physical programming units in the first physical erasing unit.

14. The memory storage device as claimed in claim 12, wherein
the memory control circuit unit is further configured to respectively obtain a distribution of the error bit numbers of the upper physical programming units, a distribution of the error bit numbers of the middle physical programming units, and a distribution of the error bit numbers of the lower physical programming units of each of the physical erasing units according to Formula (1), $$f(x; \mu, \sigma) = \frac{1}{\sigma\sqrt{2\pi}} \exp\left(-\frac{(x-\mu)^2}{2\sigma^2}\right) \quad (1)$$

wherein $\mu$ is a mean of the error bit numbers of the upper physical programming units, the middle physical programming units, and the lower physical programming units of each of the physical erasing units, is a standard deviation of the error bit numbers of the upper physical programming units, $\sigma$ the middle physical programming units, and the lower physical programming units of each of the physical erasing units, $\sigma^2$ is a variance of the error bit numbers of the upper physical programming units, the middle physical programming units, and the lower physical programming units of each of the physical erasing units, x is the error bit numbers of the upper physical programming units, the middle physical programming units, and the lower physical programming units of each of the physical erasing units, and $f(x;\mu,\sigma)$ is a distribution of error bit numbers of each of the physical erasing units.

15. The memory storage device as claimed in claim 14, wherein in an operation in which the memory control circuit unit is further configured to respectively obtain the distribution of the error bit numbers of the upper physical programming units, the distribution of the error bit numbers of the middle physical programming units, and the distribution of the error bit numbers of the lower physical programming units of each of the physical erasing units according to Formula (1), a distribution of the error bit numbers corresponding to the first physical erasing unit is a normal distribution and the memory control circuit unit is further configured to determine the first physical erasing unit as not the bad physical erasing unit if a probability that x occurs within one standard deviation is 68.2%, a probability that x occurs within two standard deviations is 95.4%, and a probability that x occurs within three standard deviations is 99.7%.

16. The memory storage device as claimed in claim 12, wherein in an operation in which the memory control circuit unit is further configured to determine whether the first physical erasing unit of the physical erasing units is the bad physical erasing unit according to the distribution of the error bit numbers of the upper physical programming units, the distribution of the error bit numbers of the middle physical programming units, and the distribution of the error bit numbers of the lower physical programming units of each of the physical erasing units, the memory control circuit unit is further configured to determine whether the first physical erasing unit is the bad physical erasing unit according to a mean of error bit numbers of the first physical erasing unit, an error bit number corresponding to the most physical programming units in the first physical erasing unit, and a median of a plurality of groups of error bit numbers corresponding to the physical programming units in the first physical erasing unit.

17. The memory storage device as claimed in claim 16, wherein the memory control circuit unit is further configured to determine the first physical erasing unit as the bad physical erasing unit if the error bit number corresponding to the most physical programming units in the first physical erasing unit is greater than the median of the groups of error bit numbers corresponding to the physical programming units in the first physical erasing unit, and the median of the groups of error bit numbers corresponding to the physical programming units in the first physical erasing unit is greater than the mean of the error bit numbers of the first physical erasing unit.

18. The memory storage device as claimed in claim 10, wherein in an operation in which the memory control circuit unit is further configured to perform the data transfer operation on the data in the first physical erasing unit, the memory control circuit unit is further configured to move the data in the first physical erasing unit to a second physical erasing unit of the physical erasing units.

19. A memory control circuit unit, configured to control a rewritable non-volatile memory module comprising a plurality of physical erasing units, wherein each of the physical erasing units comprises a plurality of physical programming units, and the memory control circuit unit comprises:

a host interface, configured to be coupled to a host system;

a memory interface, configured to be coupled to the rewritable non-volatile memory module; and a memory management circuit, coupled to the host interface and the memory interface, wherein the memory management circuit is configured to record an error bit number of each upper physical programming unit and an error bit number of each lower physical programming unit of each of the physical erasing units, wherein the memory management circuit is configured to determine whether a first physical erasing unit of the physical erasing units is a bad physical erasing unit according to a distribution of the error bit numbers of the upper physical programming units and a distribution of the error bit numbers of the lower physical programming units of the first physical erasing unit of the physical erasing units, and the memory management circuit is configured to perform a data transfer operation on data in the first physical erasing unit if the first physical erasing unit is determined as the bad physical erasing unit.

20. The memory control circuit unit as claimed in claim 19, wherein the memory management circuit is further configured to respectively calculate a mean of the error bit numbers of the upper physical programming units and a mean of the error bit numbers of the lower physical programming units of each of the physical erasing units, and the memory management circuit is further configured to determine the first physical erasing unit as the bad physical erasing unit if the mean of the error bit numbers of the upper physical programming units is greater than the mean of the error bit numbers of the lower physical programming units in the first physical erasing unit.

21. The memory control circuit unit as claimed in claim 19, wherein the memory management circuit is further configured to record an error bit number of each middle physical programming unit of each of the physical erasing units, and the memory management circuit is further configured to determine whether the first physical erasing unit is the bad physical erasing unit according to the distribution of the error bit numbers of the upper physical programming units, a distribution of the error bit numbers of the middle physical programming units, and the distribution of the error bit numbers of the lower physical programming units of the first physical erasing unit of the physical erasing units.

22. The memory control circuit unit as claimed in claim 21, wherein the memory management circuit is further configured to respectively calculate a mean of the error bit numbers of the upper physical programming units, a mean of the error bit numbers of the middle physical programming units, and a mean of the error bit numbers of the lower physical programming units of each of the physical erasing units, and the memory management circuit is further configured to determine the first physical erasing unit as the bad physical erasing unit if the mean of the error bit numbers of the upper physical programming units is greater than the mean of the error bit numbers of the middle physical programming units and the mean of the error bit numbers of the middle physical programming units is greater than the mean of the error bit numbers of the lower physical programming units in the first physical erasing unit.

23. The memory control circuit unit as claimed in claim 21, wherein the memory management circuit is further configured to respectively obtain the distribution of the error bit numbers of the upper physical programming units, the distribution of the error bit numbers of the middle physical programming units, and the distribution of the error bit numbers of the lower physical programming units of each of the physical erasing units according to Formula (1), $$f(x;\mu,\sigma) = \frac{1}{\sigma\sqrt{2\pi}}\exp\left(-\frac{(x-\mu)^2}{2\sigma^2}\right) \quad (1)$$

wherein μ is a mean of the error bit numbers of the upper physical programming units, the middle physical programming units, and the lower physical programming units of each of the physical erasing units, σ is a standard deviation of the error bit numbers of the upper physical programming units, the middle physical programming units, and the lower physical programming units of each of the physical erasing units, $\sigma^2$ is a variance of the error bit numbers of the upper physical programming units, the middle physical programming units, and the lower physical programming units of each of the physical erasing units, x is the error bit numbers of the upper physical programming units, the middle physical programming units, and the lower physical programming units of each of the physical erasing units, and f(x;μ,σ) is a distribution of error bit numbers of each of the physical erasing units.

24. The memory control circuit unit as claimed in claim 23, wherein
in an operation in which the memory management circuit is further configured to respectively obtain the distribution of the error bit numbers of the upper physical programming units, the distribution of the error bit numbers of the middle physical programming units, and the distribution of the error bit numbers of the lower physical programming units of each of the physical erasing units according to Formula (1),
a distribution of the error bit numbers corresponding to the first physical erasing unit is a normal distribution and the memory management circuit is further configured to determine the first physical erasing unit as not the bad physical erasing unit if a probability that x occurs within one standard deviation is 68.2%, a probability that x occurs within two standard deviations is 95.4%, and a probability that x occurs within three standard deviations is 99.7%.

25. The memory control circuit unit as claimed in claim 21, wherein in an operation in which the memory management circuit is further configured to determine whether the first physical erasing unit of the physical erasing units is the bad physical erasing unit according to the distribution of the error bit numbers of the upper physical programming units, the distribution of the error bit numbers of the middle physical programming units, and the distribution of the error bit numbers of the lower physical programming units of each of the physical erasing units,
the memory management circuit is further configured to determine whether the first physical erasing unit is the bad physical erasing unit according to a mean of error bit numbers of the first physical erasing unit, an error bit number corresponding to the most physical programming units in the first physical erasing unit, and a median of a plurality of groups of error bit numbers corresponding to the physical programming units in the first physical erasing unit.

26. The memory control circuit unit as claimed in claim 25, wherein
the memory management circuit is further configured to determine the first physical erasing unit as the bad physical erasing unit if the error bit number corresponding to the most physical programming units in the first physical erasing unit is greater than the median of the groups of error bit numbers corresponding to the physical programming units in the first physical erasing unit, and the median of the groups of error bit numbers corresponding to the physical programming units in the first physical erasing unit is greater than the mean of the error bit numbers of the first physical erasing unit.

27. The memory control circuit unit as claimed in claim 19, wherein in an operation in which the memory management circuit is configured to perform the data transfer operation on data in the first physical erasing unit,
the memory management circuit is further configured to move the data in the first physical erasing unit to a second physical erasing unit of the physical erasing units.

* * * * *